United States Patent
Lee et al.

(10) Patent No.: US 11,205,679 B2
(45) Date of Patent: Dec. 21, 2021

(54) MAGNETIC MEMORY DEVICE INCLUDING A FREE LAYER AND A PINNED LAYER

(71) Applicant: Samsung Electronics Co., Ltd., Gyeonggi-do (KR)

(72) Inventors: Sung Chul Lee, Osan-si (KR); Eunsun Noh, Yongin-si (KR); Jeong-Heon Park, Hwaseong-si (KR); Ung Hwan Pi, Hwasesong-si (KR)

(73) Assignee: Samsung Electronics Co., Ltd.

( * ) Notice: Subject to any disclaimer, the term of this patent is extended or adjusted under 35 U.S.C. 154(b) by 108 days.

(21) Appl. No.: 16/794,845

(22) Filed: Feb. 19, 2020

(65) Prior Publication Data
US 2021/0028228 A1 Jan. 28, 2021

(30) Foreign Application Priority Data
Jul. 22, 2019 (KR) ........................ 10-2019-0088304

(51) Int. Cl.
*H01L 27/22* (2006.01)
*G11C 11/16* (2006.01)
*H01F 10/32* (2006.01)
*H01L 43/02* (2006.01)

(52) U.S. Cl.
CPC .......... *H01L 27/228* (2013.01); *G11C 11/161* (2013.01); *H01F 10/325* (2013.01); *H01F 10/329* (2013.01); *H01F 10/3286* (2013.01); *H01L 43/02* (2013.01)

(58) Field of Classification Search
CPC ..... H01L 27/228; H01L 43/02; H01F 10/325; H01F 10/3286; H01F 10/329; G11C 11/161

USPC .......................................................... 257/427
See application file for complete search history.

(56) References Cited

U.S. PATENT DOCUMENTS

| | | |
|---|---|---|
| 7,486,551 B1 | 2/2009 | Li et al. |
| 7,667,994 B1 | 2/2010 | Moriya et al. |
| 7,684,236 B2 | 3/2010 | Lim et al. |
| 7,796,415 B2 | 9/2010 | Lee et al. |
| 7,910,232 B2 | 3/2011 | Lee et al. |
| 7,924,593 B2 | 4/2011 | Lee et al. |
| 8,045,371 B2 | 10/2011 | Lee et al. |
| 8,050,074 B2 | 11/2011 | Kim et al. |
| 8,144,503 B2 | 3/2012 | Lee et al. |
| 8,179,711 B2 | 5/2012 | Kim et al. |

(Continued)

OTHER PUBLICATIONS

Diao, Z., et al., "Half-metal CPP GMR sensor for magnetic recording", Journal of Magnetism and Magnetic Materials 356 (2014) pp. 73-81.

(Continued)

*Primary Examiner* — Jami Valentine Miller
(74) *Attorney, Agent, or Firm* — Myers Bigel, P.A.

(57) ABSTRACT

A magnetic memory device includes a conductive line extending in a first direction, a bottom electrode provided on a portion of a bottom surface of the conductive line, a free layer and a pinned layer stacked on the conductive line, a spacer layer between the free layer and the pinned layer, and a top electrode provided on a portion of a top surface of the pinned layer. The conductive line, the free layer, the pinned layer and the spacer layer have side surfaces perpendicular to the first direction, and the side surfaces are aligned with each other.

19 Claims, 9 Drawing Sheets

(56) References Cited

U.S. PATENT DOCUMENTS

| | | | |
|---|---|---|---|
| 8,213,130 B1* | 7/2012 | Fuji | G01R 33/093 |
| | | | 360/324 |
| 8,254,164 B2 | 8/2012 | Lee et al. | |
| 8,270,197 B2 | 9/2012 | Lee | |
| 8,279,667 B2 | 10/2012 | Kim et al. | |
| 8,320,152 B2 | 11/2012 | Cho et al. | |
| 8,374,052 B2 | 2/2013 | Kim et al. | |
| 8,406,029 B2 | 3/2013 | Kim et al. | |
| 8,750,012 B1 | 6/2014 | Abraham et al. | |
| 8,750,013 B1 | 6/2014 | Abraham et al. | |
| 9,042,151 B2 | 5/2015 | Annunziata et al. | |
| 9,466,787 B2 | 10/2016 | Kula et al. | |
| 9,773,540 B2 | 9/2017 | Zang et al. | |
| 10,186,551 B1* | 1/2019 | Kim | H01L 43/12 |
| 10,276,781 B2 | 4/2019 | Wei et al. | |
| 2008/0037179 A1* | 2/2008 | Ito | G11C 11/16 |
| | | | 360/313 |
| 2015/0249096 A1* | 9/2015 | Lupino | G11C 5/02 |
| | | | 257/203 |
| 2018/0122825 A1* | 5/2018 | Lupino | G11C 11/1675 |

OTHER PUBLICATIONS

Raymenants, E., et al., "Scaled spintronic logic device based on domain wall motion in magnetically interconnected tunnel junctions," IEEE, 2018, 4 pages.

* cited by examiner ial patent application claims priority under 35 U.S.C. § 119 to Korean Patent Application No. 10-2019-0088304, filed on Jul. 22, 2019, in the Korean Intellectual Property Office, the disclosure of which is hereby incorporated by reference in its entirety.

MAGNETIC MEMORY DEVICE INCLUDING A FREE LAYER AND A PINNED LAYER

CROSS-REFERENCE TO RELATED APPLICATION

This U.S. non-provisional patent application claims priority under 35 U.S.C. § 119 to Korean Patent Application No. 10-2019-0088304, filed on Jul. 22, 2019, in the Korean Intellectual Property Office, the disclosure of which is hereby incorporated by reference in its entirety.

BACKGROUND

Embodiments of the inventive concepts relate to a magnetic memory device and, more particularly, to a magnetic memory device using a magnetic domain wall.

High-speed and low-voltage memory devices have been demanded to realize high-speed and low-power electronic devices including memory devices. A magnetic memory device has been studied as a memory device satisfying these demands. The magnetic memory device has been spotlighted as a next-generation memory device because of its high-speed operation characteristic and/or non-volatile characteristic.

SUMMARY

Embodiments of the inventive concepts may provide a magnetic memory device capable of improving reliability and integration density. In particular, a new magnetic memory device using a movement principle of a magnetic domain wall of a magnetic material has been studied and developed.

In some embodiments, a magnetic memory device may include a conductive line extending in a first direction, a bottom electrode on a portion of a bottom surface of the conductive line, a free layer and a pinned layer stacked on the conductive line, a spacer layer between the free layer and the pinned layer, and a top electrode on a portion of a top surface of the pinned layer. The conductive line, the free layer, the pinned layer and the spacer layer may have side surfaces perpendicular to the first direction, and the side surfaces may be aligned with each other.

In some embodiments, a magnetic memory device may include a substrate, packet structures extending in a first direction on the substrate and spaced apart from each other in a second direction perpendicular to the first direction, bottom and top electrodes spaced apart from each other in a third direction perpendicular to the first and second directions with respective portions of corresponding ones of the packet structures between corresponding bottom and top electrodes, transistors connected to respective ones the bottom electrode of corresponding ones of the packet structures, and a bit line connected to the top electrodes of the packet structures. Each of the packet structures may include a free layer, a pinned layer on the free layer, a spacer layer between the free layer and the pinned layer, and a conductive line between the free layer and the bottom electrode. The areas of top surfaces of the free layer, the pinned layer, the spacer layer and the conductive line may be substantially equal to each other.

In some embodiments, a magnetic memory device may include a first magnetic layer having a constant magnetization direction, a second magnetic layer on the first magnetic layer, a spacer layer between the first magnetic layer and the second magnetic layer, and a conductive line on a bottom surface of the first magnetic layer. The first magnetic layer, the second magnetic layer, the spacer layer and the conductive line may extend in a first direction and may have top surfaces of which areas are substantially equal to each other.

BRIEF DESCRIPTION OF THE DRAWINGS

The inventive concepts will become more apparent in view of the attached drawings and accompanying detailed description.

DETAILED DESCRIPTION

Magnetic memory devices according to some embodiments of the inventive concepts will be described more fully hereinafter with reference to the accompanying drawings.

Figure 1:
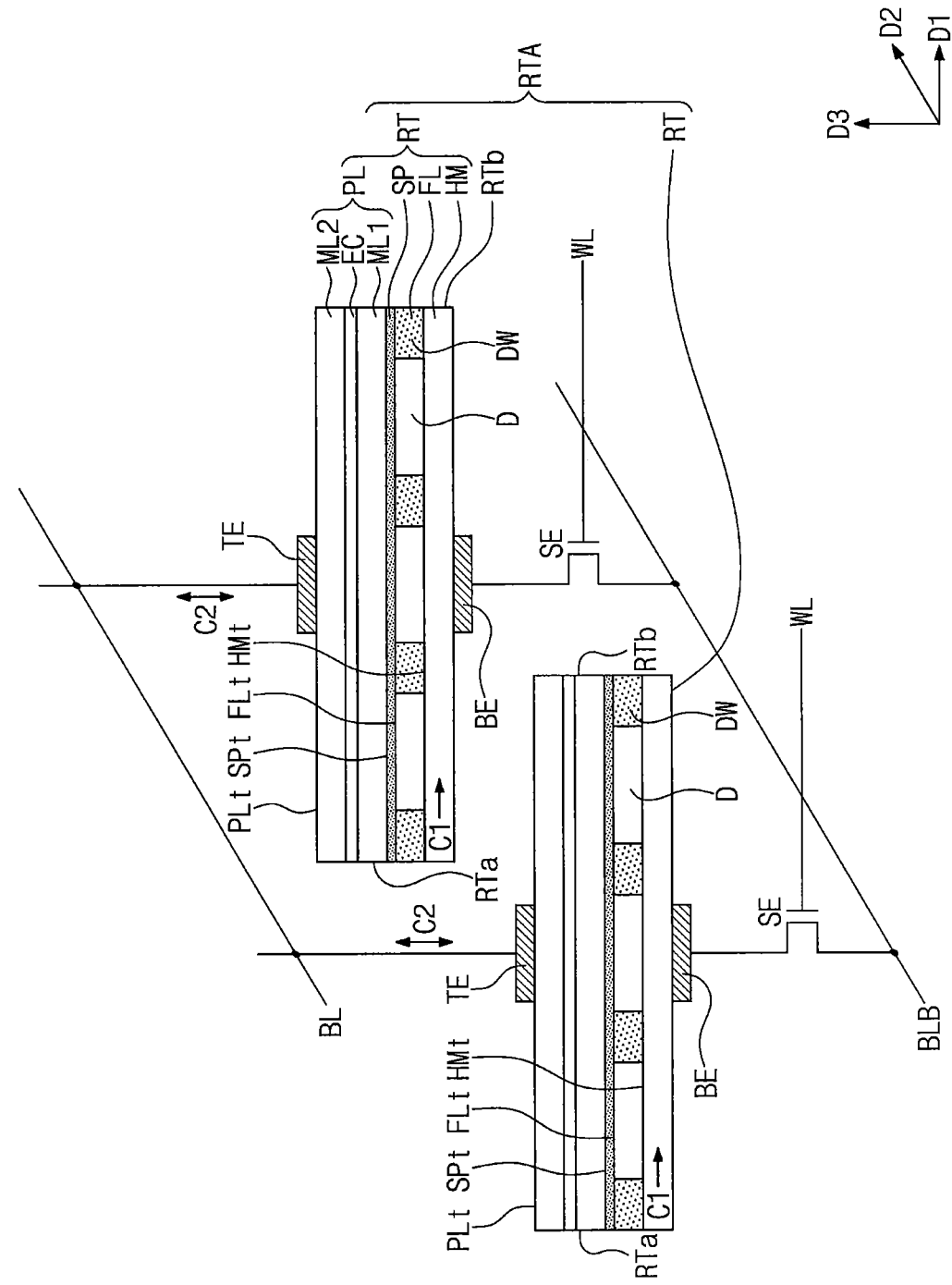
FIG. 1 is a schematic conceptual view illustrating a magnetic memory device according to some embodiments of the inventive concepts.

FIG. 1 is a schematic conceptual view illustrating a magnetic memory device according to some embodiments of the inventive concepts.

Referring to FIG. 1, a plurality of magnetic packet structures RT may be provided. Each of the magnetic packet structures RT may extend in a first direction D1. The magnetic packet structures RT may be referred to as packet structures. The magnetic packet structures RT may be spaced apart from each other in a second direction D2 perpendicular to the first direction D1. A space between the magnetic packet structures RT may be filled with an insulating material. A width, in the second direction D2, of each of the magnetic packet structures RT may be several tens of nanometers (nm). A distance between the magnetic packet structures RT adjacent to each other in the second direction D2 may be several tens of nanometers (nm). The plurality of magnetic packet structures RT may include a magnetic packet structure array RTA. The magnetic packet structure array RTA may be provided in plurality. The plurality of magnetic packet structure arrays RTA may be spaced apart from each other in a third direction D3 perpendicular to the first direction D1 and the second direction D2. In other words, the plurality of magnetic packet structure arrays RTA may be three-dimensionally arranged. Thus, an integration density of the magnetic memory device according to the inventive concepts may be increased.

A top electrode TE and a bottom electrode BE may be provided on portions of top and bottom surfaces of each of the magnetic packet structures RT, respectively. The top electrode TE and the bottom electrode BE may overlap with each other in the third direction D3 with the magnetic packet structure RT interposed therebetween. Lengths of the top and bottom electrodes TE and BE in the first direction D1 may be less than a length of each of the magnetic packet structures RT in the first direction D1. Widths of the top and bottom electrodes TE and BE in the second direction D2 may be equal to or less than the width of each of the magnetic packet structures RT in the second direction D2. The top electrode TE may be connected to a bit line BL. The bottom electrode BE may be connected to a complementary bit line BLB through a selection element SE. The selection element SE may be a diode, a bipolar transistor, or a metal oxide semiconductor-field effect transistor. The selection element SE may be controlled by a word line WL. Even though not shown in the drawings, each of the magnetic packet structures RT may be connected to elements for controlling a current at both sidewalls RTa and RTb corresponding to its both ends in the first direction D1 and a direction opposite to the first direction D1. Hereinafter, a single magnetic packet structure RT will be described but the concepts described herein may be applied to other magnetic packet structures.

The magnetic packet structure RT may include a conductive line HM, a free layer FL, a spacer layer SP, and a pinned layer PL. Each of the sidewalls RTa and RTb, perpendicular to the first direction D1, of the magnetic packet structure RT may have surfaces aligned with each other. In other words, side surfaces of the conductive line HM, the free layer FL, the spacer layer SP and the pinned layer PL, which are perpendicular to the first direction D1, may be aligned with each other. The magnetic packet structure RT may extend in the first direction D1 between the top electrode TE and the bottom electrode BE. The conductive line HM, the free layer FL, the spacer layer SP and the pinned layer PL may be sequentially stacked in the third direction D3. A top surface HMt of the conductive line HM, a top surface FLt of the free layer FL, a top surface SPt of the spacer layer SP and a top surface PLt of the pinned layer PL may have substantially the same area. The top surface HMt of the conductive line HM, the top surface FLt of the free layer FL, the top surface SPt of the spacer layer SP and the top surface PLt of the pinned layer PL may be parallel to the first direction D1 and may be perpendicular to the third direction D3.

The conductive line HM may be provided on the bottom electrode BE. A length of the conductive line HM in the first direction D1 may be greater than the length of the bottom electrode BE in the first direction D1. The conductive line HM may include a material that has a large magnitude of spin-orbit coupling when a current flows therethrough. In the event that an atomic number of a material is large (e.g., about 30 or more), the magnitude of the spin-orbit coupling of the material may be large when a current flows therethrough. In more detail, the magnitude of the spin-orbit coupling may be in proportion to the 4th power of the atomic number. Thus, the conductive line HM may include a heavy metal of which an atomic number is about 30 or more. The conductive line HM may include, for example, iridium (Ir), tantalum (Ta), platinum (Pt), palladium (Pd), bismuth (Bi), titanium (Ti), or tungsten (W).

A first current C1 may flow through the conductive line HM. The first current C1 may flow in the first direction D1 or the direction opposite to the first direction D1. The first current C1 flowing through the conductive line HM may rotate a magnetization direction in the free layer FL. A concept that the first current C1 rotates the magnetization direction in the free layer FL will be described later in more detail with reference to FIG. 4.

The free layer FL may be provided on the top surface HMt of the conductive line HM. In some embodiments, the free layer FL may have a single-layered structure. The free layer FL may include a plurality of magnetic domains D and magnetic domain walls DW. Each of the magnetic domains D may be a region in a uniform spin state, which is generated by exchange interaction of aligning adjacent spins in parallel to each other in a magnetic body. Sizes and magnetization directions of the magnetic domains D may be appropriately controlled by a shape and/or a size of a magnetic material and external energy. Each of the magnetic domain walls DW may provide a boundary portion between the magnetic domains D having different magnetization directions. The magnetic domain walls DW may move due to a magnetic field or current applied to a magnetic material.

The magnetic domains D may include at least one unit magnetic domain. The unit magnetic domain may provide a minimum region capable of storing data. A length of the unit magnetic domain in the first direction D1 may be equal to or greater than the lengths of the top and bottom electrodes TE and BE in the first direction D1. The magnetic domains D including a plurality of the unit magnetic domains may not include a magnetic domain wall DW between the unit magnetic domains. However, the magnetic domain wall DW may be formed between the unit magnetic domains which are adjacent to each other and have magnetization directions opposite to each other. The magnetic domain walls DW may have a constant width in the first direction D1 to minimize a sum of exchange interaction energy and anisotropy energy in a magnetic body. In other words, a magnetization direction may not be discontinuously reversed at a boundary of the magnetic domains D, but the magnetic domain walls DW having the constant width in the first direction D1 may be formed between the magnetic domains D. Magnetization directions in the magnetic domain walls DW may gradually rotate. Meanwhile, the integration density of the magnetic memory device may be improved as the widths of the magnetic domain walls DW in the first direction D1 are reduced. In the magnetic memory device, according to some embodiments of the inventive concepts, the width of the magnetic domain wall DW in the first direction D1 may range from several nanometers (nm) to several tens of nanometers (nm).

Meanwhile, when the sum of the exchange interaction energy and the anisotropy energy in the magnetic body is the minimum value, the width (w) of the magnetic domain wall DW in the first direction D1 may be expressed by a proportional equation corresponding to the following equation 1. In more detail, the exchange interaction energy may be in inverse proportion to the width (w), and the anisotropy energy may be in proportion to the width (w). Due to the existence of the magnetic domain wall, total energy may be calculated by adding the exchange interaction energy and the anisotropy energy. The total energy may be differentiated with respect to the width (w) to obtain the minimum value of the total energy. When the total energy has the minimum value, the width (w) may satisfy the proportional equation as the following equation 1. In the following equation 1, 'A' is an exchange stiffness constant and 'K' is an anisotropy constant. A unit of the width (w) is a meter (m), a unit of 'A' is J/m, and a unit of 'K' is J/m³.

$$w \propto \sqrt{\frac{A}{K}}$$ [Equation 1]

The 'K' value when the free layer FL including the magnetic domains D has perpendicular magnetic anisotropy (PMA) may be greater than the 'K' value when the free layer FL has in-plane magnetic anisotropy (IMA). In other words, when the free layer FL has the perpendicular magnetic anisotropy (PMA), the width of the magnetic domain wall DW in the first direction D1 may be further reduced. Thus, the magnetization direction of each of the magnetic domains D may be parallel to the third direction D3 or may be anti-parallel to the third direction D3. In other words, the free layer FL may include a ferromagnetic metal having the perpendicular magnetic anisotropy (PMA). Here, magnetic anisotropy may be a property that shows a preference for a specific direction when spins are aligned by a magnetic field in a ferromagnetic material. The perpendicular magnetic anisotropy (PMA) may be a property preferring a magnetization direction perpendicular to the widest surface of a ferromagnetic body, and the in-plane magnetic anisotropy (IMA) may be a property preferring a magnetization direction parallel to the widest surface of a ferromagnetic body.

For example, the free layer FL may include at least one of cobalt (Co), iron (Fe), or nickel (Ni). In addition, the free layer FL may further include at least one selected from non-magnetic materials including boron (B), zinc (Zn), aluminum (Al), titanium (Ti), ruthenium (Ru), tantalum (Ta), silicon (Si), silver (Ag), gold (Au), copper (Cu), carbon (C), or nitrogen (N).

In certain embodiments, the free layer FL may include CoFe, CoNi, or NiFe and may further include boron (B). In addition, to reduce a saturation magnetization of the free layer FL, the free layer FL may further include at least one of titanium (Ti), aluminum (Al), silicon (Si), magnesium (Mg), or tantalum (Ta).

In certain embodiments, the free layer FL may include at least one of a material having a $L1_0$ crystal structure, a material having a hexagonal close packed (HCP) lattice structure, or an amorphous rare earth-transition metal (RE-TM) alloy. The material having the $L1_0$ crystal structure may include, for example, $Fe_{50}Pt_{50}$, $Fe_{50}Pd_{50}$, $Co_{50}Pt_{50}$, $Co_{50}Pd_{50}$, or $Fe_{50}Ni_{50}$. The material having the HCP lattice structure may include, for example, a cobalt-platinum (CoPt) disordered alloy having a platinum (Pt) content of about 10% to about 45%, or a $Co_3Pt$ ordered alloy. The amorphous RE-TM may include, for example, terbium (Tb), dysprosium (Dy), or gadolinium (Gd).

The pinned layer PL may be provided on the free layer FL. The area of the top surface PLt of the pinned layer PL may be substantially equal to the area of the top surface FLt of the free layer FL. When the area of the top surface PLt of the pinned layer PL is substantially equal to the area of the top surface FLt of the free layer FL, a magnitude of a stray field caused in the free layer FL from the pinned layer PL may be small. When the magnitude of the stray field is reduced, stability of data stored in the magnetic domains D of the free layer FL may be improved. In some embodiments, the pinned layer PL may include a first magnetic layer ML1, an exchange coupling layer EC, and/or a second magnetic layer ML2. In other words, the pinned layer PL may have a synthetic anti-ferromagnetic (SAF) structure. The SAF structure may improve or increase magnetization stability of the pinned layer PL by the exchange coupling layer EC. In addition, the SAF structure may reduce the magnitude of the stray field caused in the free layer FL from the pinned layer PL, thereby improving or increasing the stability of the data stored in the magnetic domains D of the free layer FL. Each of magnetization directions of the first and second magnetic layers ML1 and ML2 may be parallel to the third direction D3 or may be anti-parallel to the third direction D3. The magnetization directions of the first and second magnetic layers ML1 and ML2 may be anti-parallel to each other. Each of the first and second magnetic layers ML1 and ML2 may include at least one of the materials of the free layer FL described above. The magnetization directions of the first and second magnetic layers ML1 and ML2 may be anti-parallel to each other and may be fixed.

The exchange coupling layer EC may be between the first magnetic layer ML1 and the second magnetic layer ML2. The exchange coupling layer EC may include at least one of, for example, ruthenium (Ru), iridium (Ir), rhodium (Rh), or osmium (Os). The exchange coupling layer EC may couple the first and second magnetic layers ML1 and ML2 in such a way that the magnetization directions of the first and second magnetic layers ML1 and ML2 are anti-parallel to each other by a Ruderman-Kittel-Kasuya-Yosida (RKKY) interaction. Magnetic fields generated by the first and second magnetic layers ML1 and ML2 may cancel each other due to the action of the exchange coupling layer EC. Thus, a net magnetic field of the whole of the pinned layer PL may be minimized. Since the net magnetic field of the pinned layer PL is minimized, it is possible to minimize the influence of the magnetic field of the pinned layer PL on the free layer FL.

The spacer layer SP may be provided between the free layer FL and the pinned layer PL. For example, a thickness of the spacer layer SP in the third direction D3 may range from about 0.1 nm to about 10 nm. In addition, a resistivity of a material included in the spacer layer SP may range from about 1 μohm·cm to about 100 μohm·cm. The spacer layer SP may include a metal material. For example, the spacer layer SP may include at least one of silver (Ag), copper (Cu), chromium (Cr), gold (Au), rhodium (Rh), CrMn, or $Ag_3Mg$. In particular, the spacer layer SP may include silver (Ag) or copper (Cu). As the resistivity of the spacer layer SP decreases, a flow of a second current C2 may be confined between the top electrode TE and the bottom electrode BE. Thus, accuracy and reliability of read and write operations may be improved. The flow of the second current C2 may be confined between the top electrode TE and the bottom electrode BE by the spacer layer SP, and thus the pinned layer PL may be provided on the free layer FL without a patterning process. As a result, it is possible to prevent the free layer FL from being damaged in a patterning process.

Figure 2:
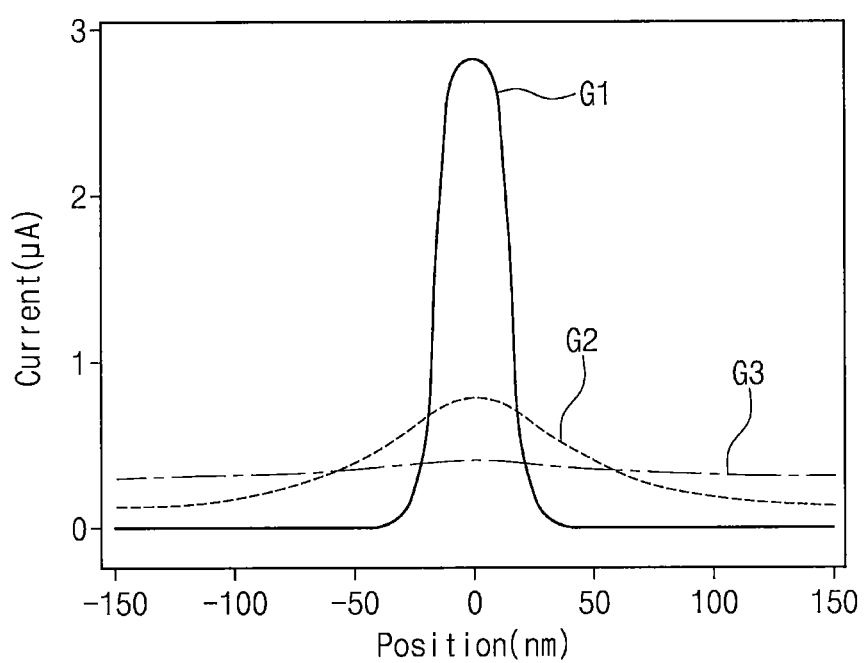
FIG. 2 is a graph showing a current change according to a resistivity of a spacer layer in the magnetic memory device of FIG. 1.

FIG. 2 is a graph showing a current change according to a resistivity of a spacer layer in the magnetic memory device of FIG. 1.

Referring to FIGS. 1 and 2, an x axis in the graph represents a position in the first direction D1, at which a current is measured. A position at which an imaginary line connecting centers of the top and bottom electrodes TE and BE meets the spacer layer SP may be set as a reference position (0 nm) in the x axis. In addition, the first direction D1 may be set as a positive direction, and the direction opposite to the first direction D1 may be set as a negative direction. In the graph, a y axis represents an intensity of a current flowing in the third direction D3 or a direction opposite to the third direction D3, and may be measured in units of μA.

A first curved line G1, a second curved line G2 and a third curved line G3 represent results measured when the resistivity of the spacer layer SP is about 5 μohm·cm, about 6000 μohm·cm, and about 0.06 ohm·cm, respectively. As shown in the graph, the current may be concentrated in a portion of the spacer layer SP, which overlaps with the top and bottom electrodes TE and BE in the third direction D3, as the resistivity of the spacer layer SP decreases. On the contrary, the current may uniformly flow in all directions in the spacer layer SP as the resistivity of the spacer layer SP increases.

Figure 3A:
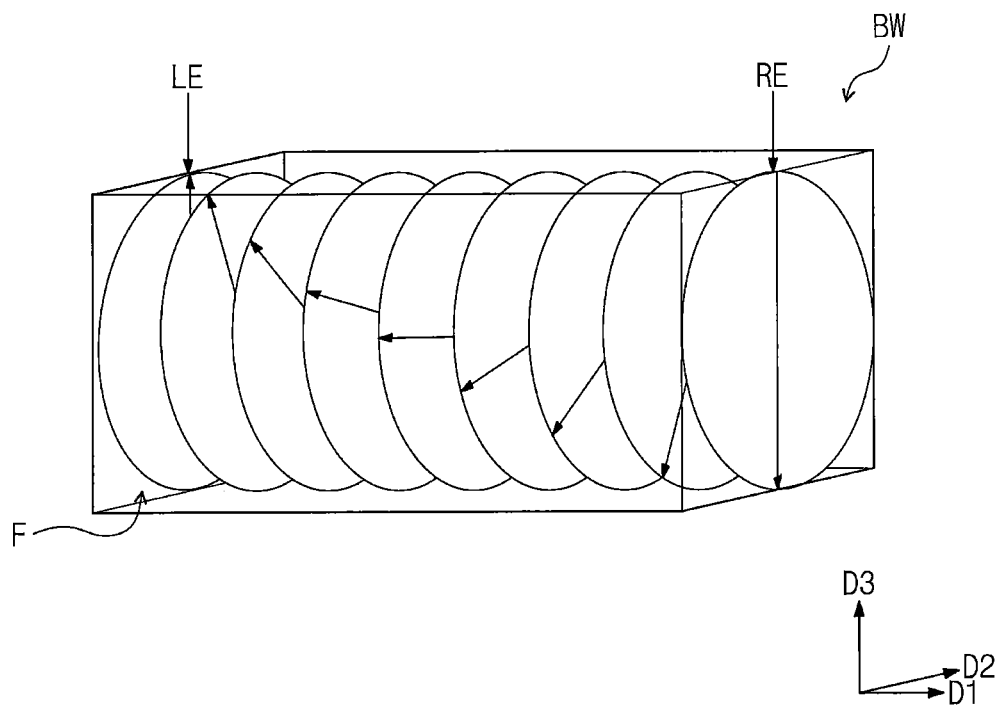
FIGS. 3A and 3B are conceptual views illustrating a process in which a magnetic domain wall is formed between magnetic domains having magnetization directions opposite to each other.
Figure 3B:
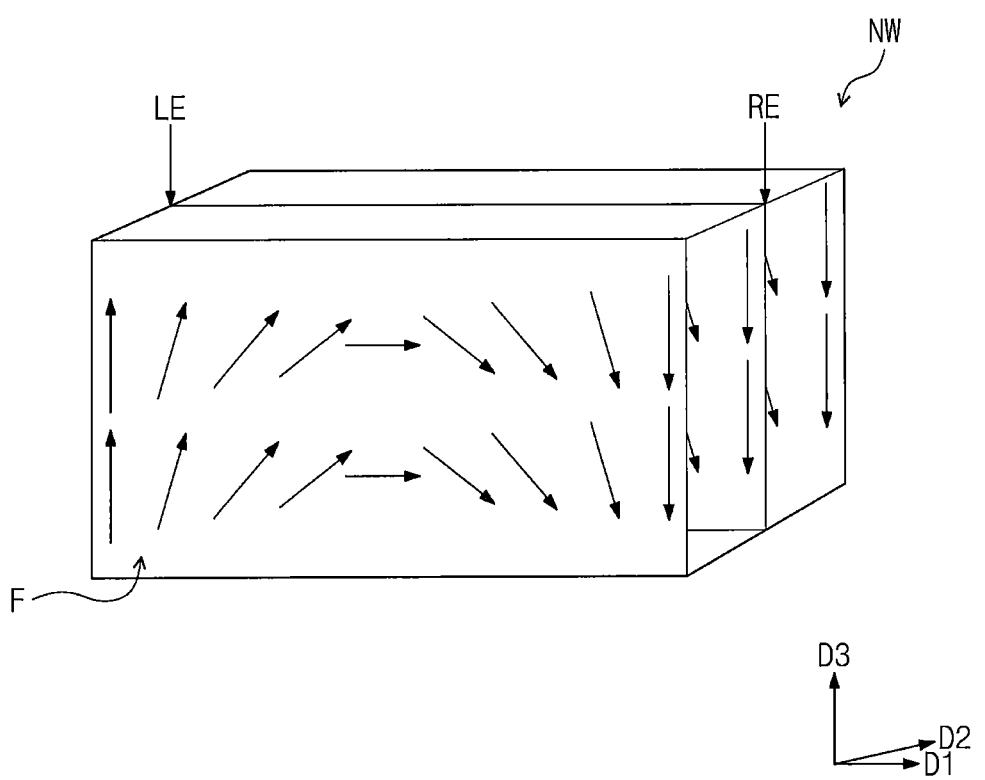

FIGS. 3A and 3B are conceptual views illustrating a process in which a magnetic domain wall is formed between magnetic domains having magnetization directions opposite to each other.

For example, a Bloch domain wall BW of FIG. 3A or a Neel domain wall NW of FIG. 3B may be generated according to a method in which a magnetization direction rotates in a magnetic domain wall.

Referring to FIGS. 3A and 3B, the Bloch domain wall BW and the Neel domain wall NW may extend in the first direction D1. Each of the Bloch domain wall BW and the Neel domain wall NW may have a magnetization direction parallel to the third direction D3 at its left side end LE and may have a magnetization direction anti-parallel to the third direction D3 at its right side end RE. However, the magnetization direction of the Bloch domain wall BW may rotate out of a front surface F of the domain wall while traveling in the first direction D1, but the magnetization direction of the Neel domain wall NW may rotate in a front surface F of the domain wall while traveling in the first direction D1. The possibility of generation of the Bloch domain wall BW may be high when a thickness of a magnetic domain wall in the third direction D3 is thicker than a threshold thickness due to the influence of a stray field. On the contrary, the possibility of generation of the Neel domain wall NW may be high when the thickness of the magnetic domain wall in the third direction D3 is thin (e.g., equal to or less than a certain thickness or a threshold thickness).

In addition, when Dzyaloshinskii Moriya interaction (DMI) occurs at an interface between a magnetic layer and a non-magnetic layer adjacent to the magnetic layer, the possibility of generation of the Neel domain wall NW may be higher. The Neel domain wall NW may increase a speed of current induced domain wall motion (CIDWM).

Hereinafter, the magnetic domain walls are illustrated as the Neel domain walls NW. However, embodiments of the inventive concepts are not limited thereto. In certain embodiments, based on a property of a magnetic layer, the magnetic domain wall may be one of various domain walls such as the Bloch domain wall BW, a transverse domain wall, a vortex domain wall, and/or a cross-tie domain wall.

Figure 4:
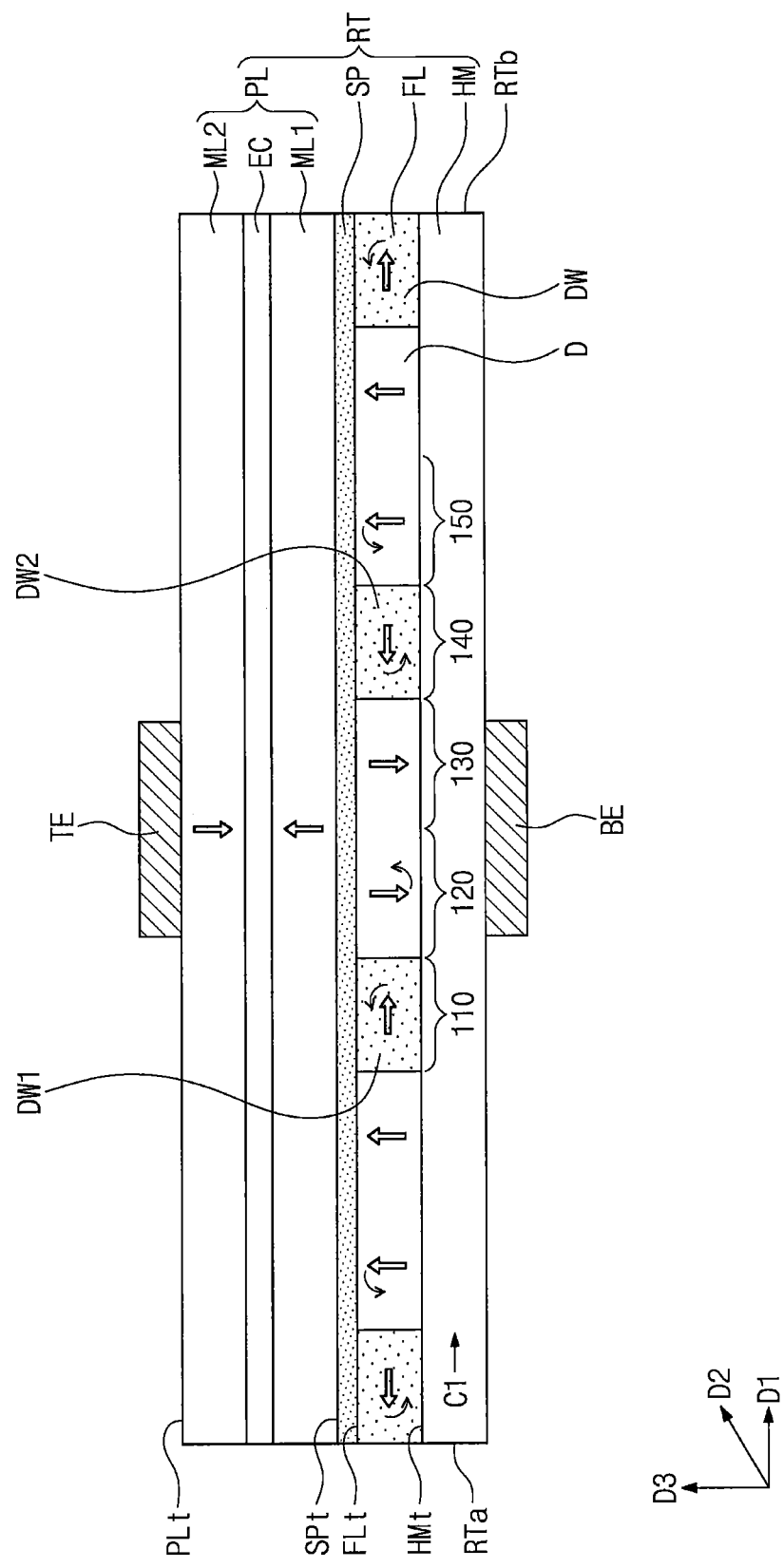
FIG. 4 is a conceptual view illustrating a magnetic packet structure to describe a method of moving a magnetic domain wall through a flow of a first current.
Figure 5:
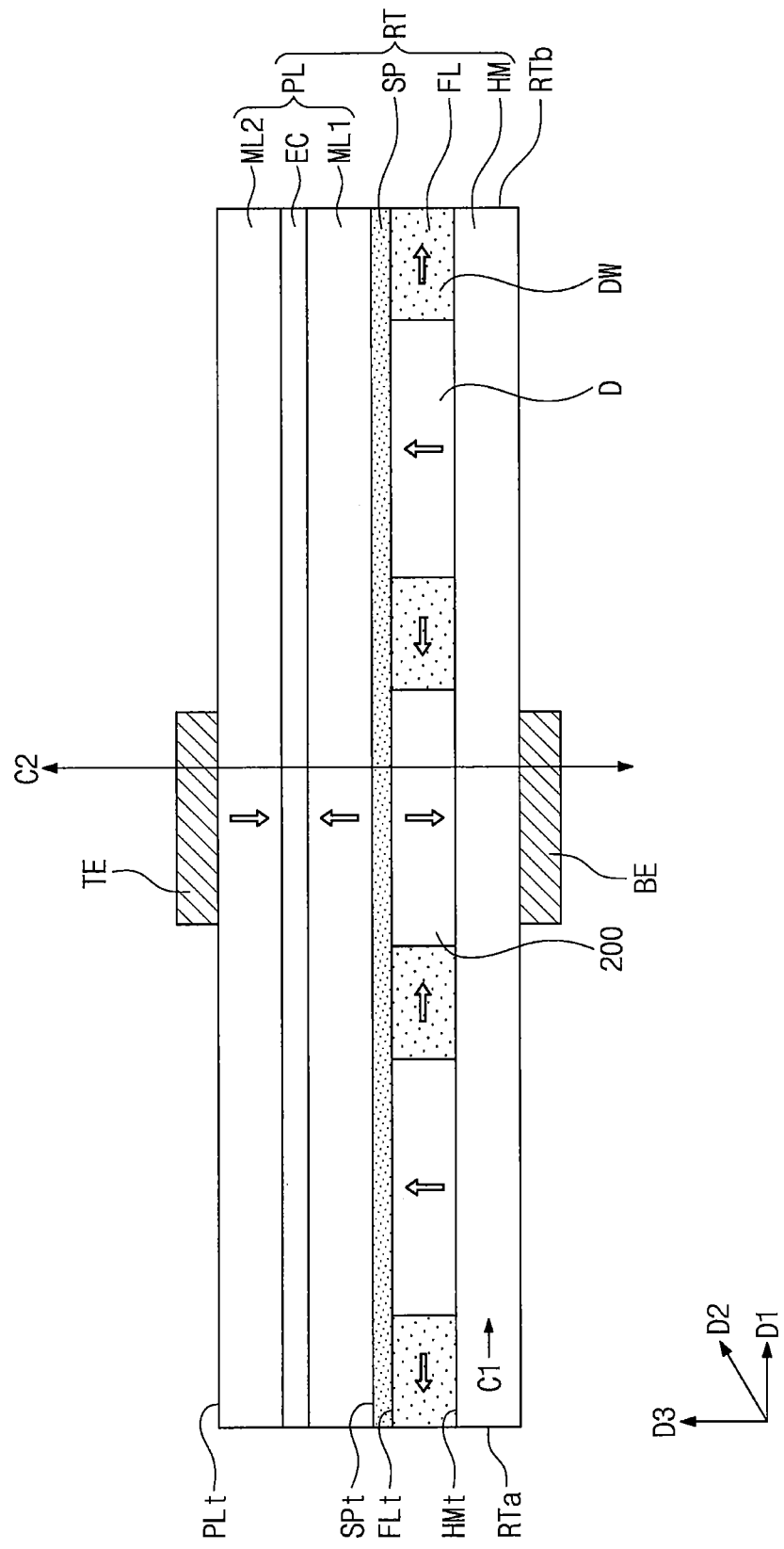
FIG. 5 is a conceptual view illustrating a magnetic packet structure to describe a read/write operation method through a flow of a second current.

FIG. 4 is a conceptual view illustrating a magnetic packet structure to describe a method of moving a magnetic domain wall through a flow of a first current, and FIG. 5 is a conceptual view illustrating a magnetic packet structure to describe a read/write operation method through a flow of a second current.

Referring to FIG. 4, the first current C1 may flow through the conductive line HM in the first direction D1 or the direction opposite to the first direction D1. When the first current C1 flows through the conductive line HM, a spin hall effect (SHE) and a Rashba effect may occur by spin-orbit coupling of electrons in the conductive line HM. The spin-orbit coupling may be the coupling of spins and orbit motions of the electrons. The spin hall effect (SHE) may be a principle similar to the hall effect and may include an effect in which spins are accumulated on a surface of a conductor by the spin-orbit coupling. The Rashba effect may be an effect in which a state of an electron spin of a non-magnetic body is changed by a potential difference. The Rashba effect may be enhanced by asymmetry of an interface between the conductive line HM and the free layer FL. The spin hall effect (SHE) and the Rashba effect may accumulate spin-polarized electrons in a place, close to the free layer FL, in the conductive line HM. In other words, a spin current may flow from the conductive line HM toward the free layer FL by the spin hall effect (SHE) and the Rashba effect. The spin current may apply spin-orbit torque (SOT) to the free layer FL, and thus the magnetic domain walls DW in the free layer FL may be quickly moved without an external magnetic field.

A movement direction $S_{DWM}$ of the magnetic domain walls DW may be determined by multiplying a designator $S_{ST}$ of a spin torque coefficient and a designator $S_J$ representing a direction of an applied current. Here, the designator $S_{ST}$ of the spin torque coefficient may be determined by multiplying a designator $S_{SOT}$ of a spin-orbit torque and a designator $S_{DMI}$ of the Dzyaloshinskii Moriya interaction (DMI). Thus, the movement direction $S_{DWM}$ of the magnetic domain walls DW may be determined by the following equation 2. Meanwhile, the Dzyaloshinskii Moriya interaction (DMI) may be an asymmetrical phenomenon based on spin-orbit coupling. In more detail, the Dzyaloshinskii Moriya interaction (DMI) may be a phenomenon that when a magnetic layer is in contact with a non-magnetic layer, spins existing at an interface of the magnetic layer are coupled to orbits of electrons existing in the non-magnetic layer. A spin structure spatially rotating in only a specific direction may occur by the Dzyaloshinskii Moriya interaction (DMI).

$$S_{DWM}=S_{ST}\times S_J=S_{SOT}\times S_{DMI}\times S_J \quad \text{[Equation 2]}$$

Hereinafter, first to fifth regions 110, 120, 130, 140 and 150 which are portions of the magnetic packet structure RT will be described with reference to FIG. 4. The first to fifth regions 110 to 150 may be arbitrarily set to describe a movement principle of the magnetic domain wall. The magnetic domain wall may move in other regions except the first to fifth regions 110 to 150 by the principle to be described using the first to fifth regions 110 to 150.

The first to fifth regions 110 to 150 may be sequentially arranged in the first direction D1 in the magnetic packet structure RT. Before applying a current, the magnetic domain walls DW may be provided in the first region 110 and the fourth region 140. Before applying a current, the magnetic domains D may be provided in the second region 120, the third region 130, and the fifth region 150. Lengths of the first and second regions 110 and 120 in the first direction D1 may be substantially equal to each other. Lengths of the fourth and fifth regions 140 and 150 in the first direction D1 may be substantially equal to each other.

When the first current C1 flows through the conductive line HM in the first direction D1, magnetization directions in the first, second, fourth and fifth regions 110, 120, 140 and 150, respectively, may be changed. The magnetization directions in the first, second, fourth and fifth regions 110, 120, 140 and 150 may be changed in a counterclockwise direction. When the magnetization directions are changed, a first magnetic domain wall DW1 in the first region 110 may be moved into the second region 120, and a second magnetic domain wall DW2 in the fourth region 140 may be moved into the fifth region 150. The magnetic domain walls DW may move in the first direction D1 by the change of the magnetization directions of the regions. This process may be referred to as the current induced domain wall motion (CIDWM). The designator $S_{ST}$ of the spin torque coefficient may be determined according to an inherent property of a material included in the magnetic packet structure RT, and thus the direction of the current induced domain wall motion (CIDWM) determined by equation 2 may be controlled by adjusting the direction $S_J$ of the first current C1.

Referring to FIG. 5, in a read or write operation, the second current C2 may flow between the top electrode TE and the bottom electrode BE in the third direction D3 or the direction opposite to the third direction D3. The second current C2 may flow perpendicularly to the top surface PLt of the pinned layer PL and the top surface Flt of the free layer FL, thereby measuring a resistance between the top electrode TE and the bottom electrode BE. Since the magnetic domain walls DW are moved, a magnetization direction of a magnetic domain 200 disposed between the top and bottom electrodes TE and BE may be changed. A resistance $R_p$ when the magnetization direction of the magnetic domain 200 is parallel to the magnetization direction of the pinned layer PL may be less than a resistance $R_{ap}$ when the magnetization direction of the magnetic domain 200 is anti-parallel to the magnetization direction of the pinned layer PL. The read operation may be performed by determining whether the resistance between the top and bottom electrodes TE and BE is high or low. Meanwhile, a magnetoresistance ratio MR may be defined as the following equation 3.

$$MR = \frac{R_{ap} - R_p}{R_p} \times 100(\%) \quad \text{[Equation 3]}$$

As the magnetoresistance ratio MR increases, accuracy and reliability of the read operation may be improved. When the area of the top surface PLt of the pinned layer PL is substantially equal to the area of the top surface FLt of the free layer FL, the spacer layer SP, which has low resistivity, may confine the flow of the second current C2 between the top electrode TE and the bottom electrode BE, thereby increasing the magnetoresistance ratio MR.

When the second current C2 having a current density of a certain magnitude or more flows, the magnetization direction of the magnetic domain 200 between the top and bottom electrodes TE and BE may be reversed. A critical current density $J_c$ may be a magnitude of a current density needed to reverse the magnetization direction of the magnetic domain 200. The magnetization direction of the magnetic domain 200 may be reversed by the second current C2 having a current density greater than the critical current density $J_c$, thereby performing a write operation. A traveling direction of the second current C2 in the write operation may be the same as a traveling direction of the second current C2 in the read operation, but the magnitude of the current density of the second current C2 in the write operation may be different from the magnitude of the current density of the second current C2 in the read operation.

Figure 6:
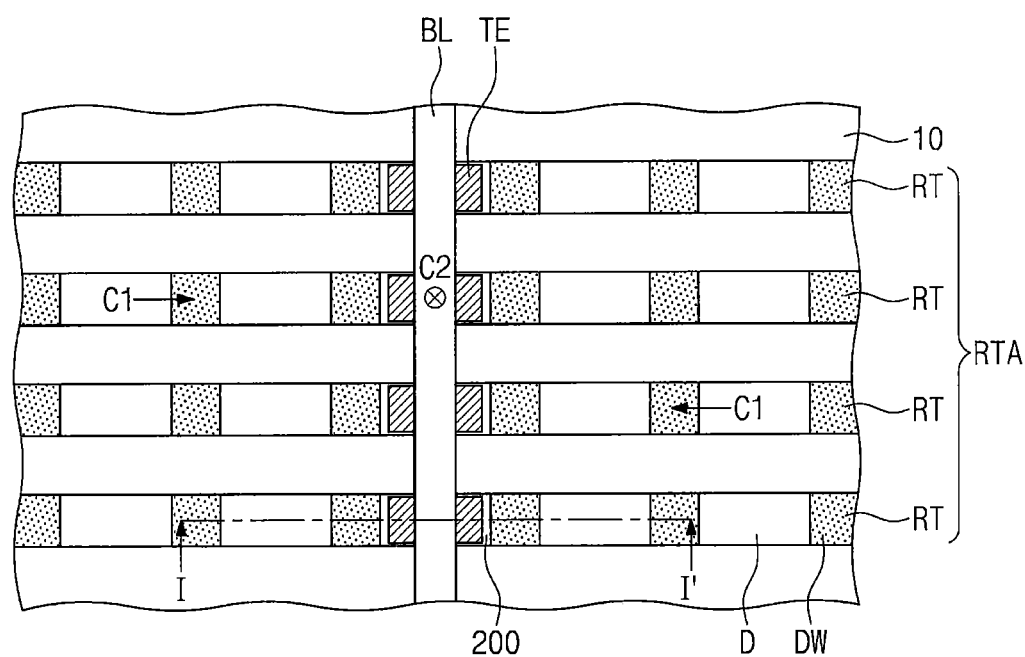
FIG. 6 is a plan view illustrating a magnetic packet structure array in which magnetic packet structures are arranged.
Figure 6:
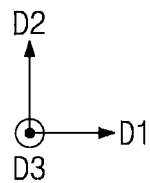
Figure 7:
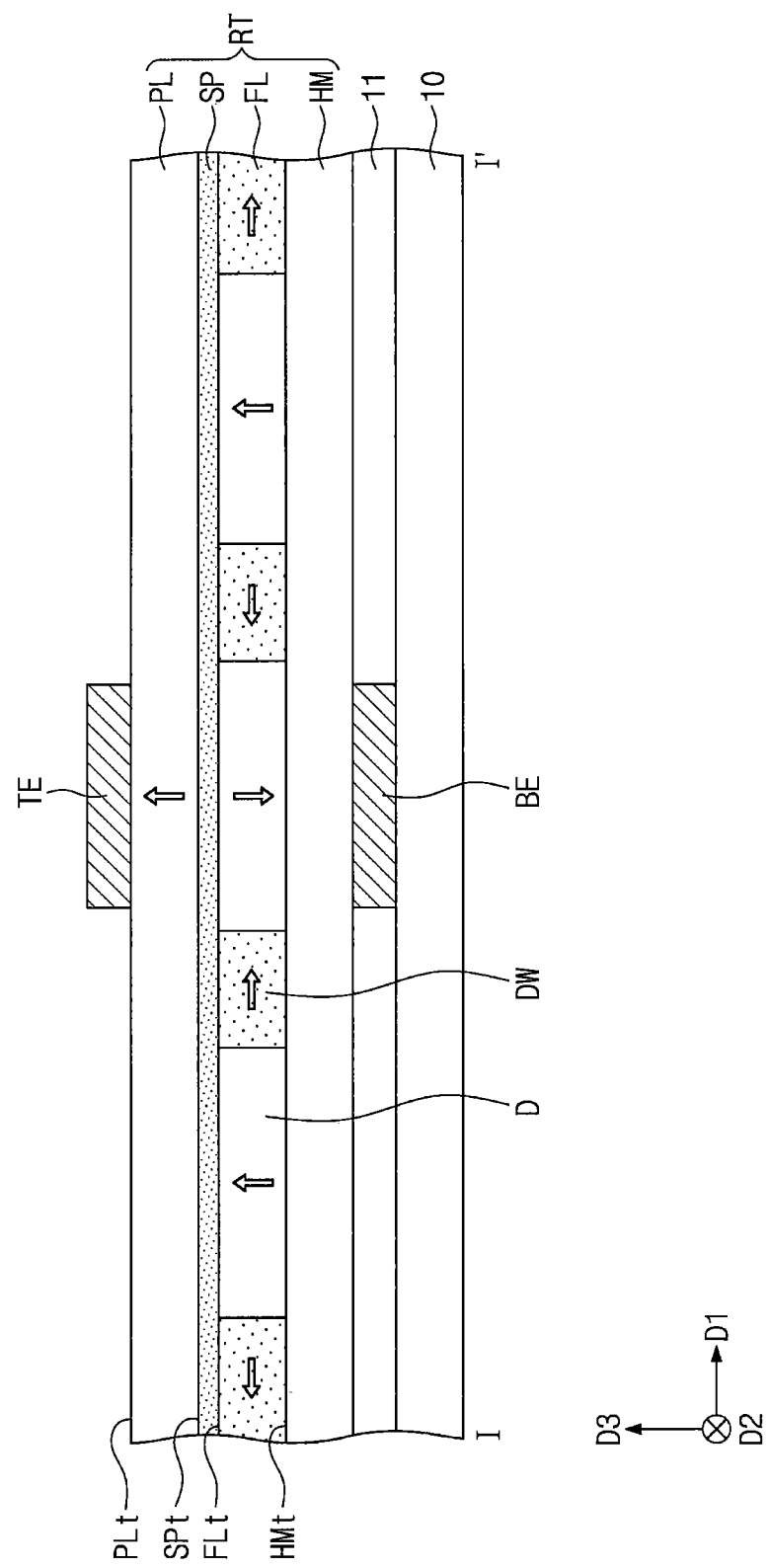
FIGS. 7 to 9 are cross-sectional views taken along a line I-I' of FIG. 6 to illustrate magnetic memory devices according to some embodiments of the inventive concepts.
Figure 8:
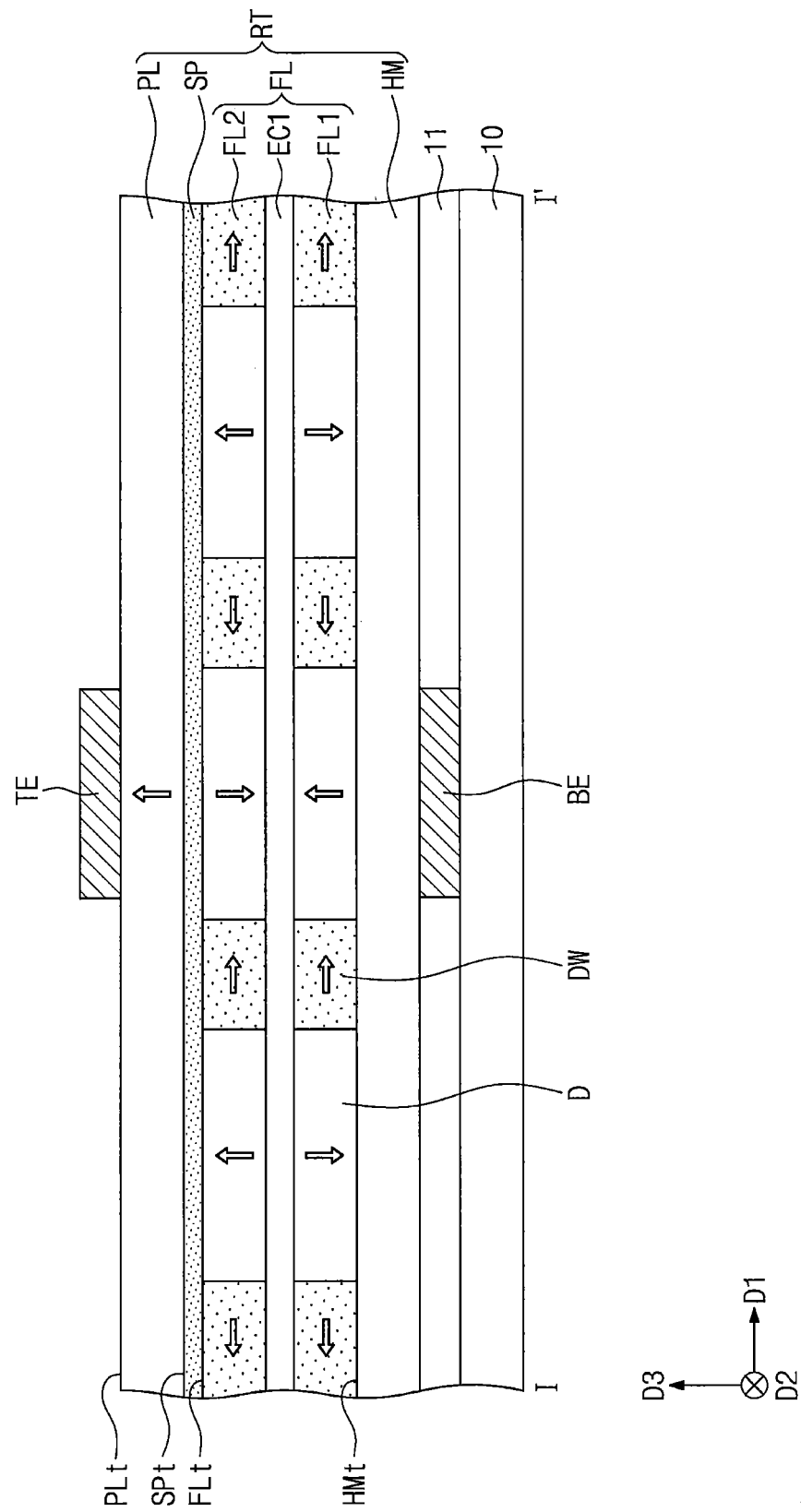
Figure 9:
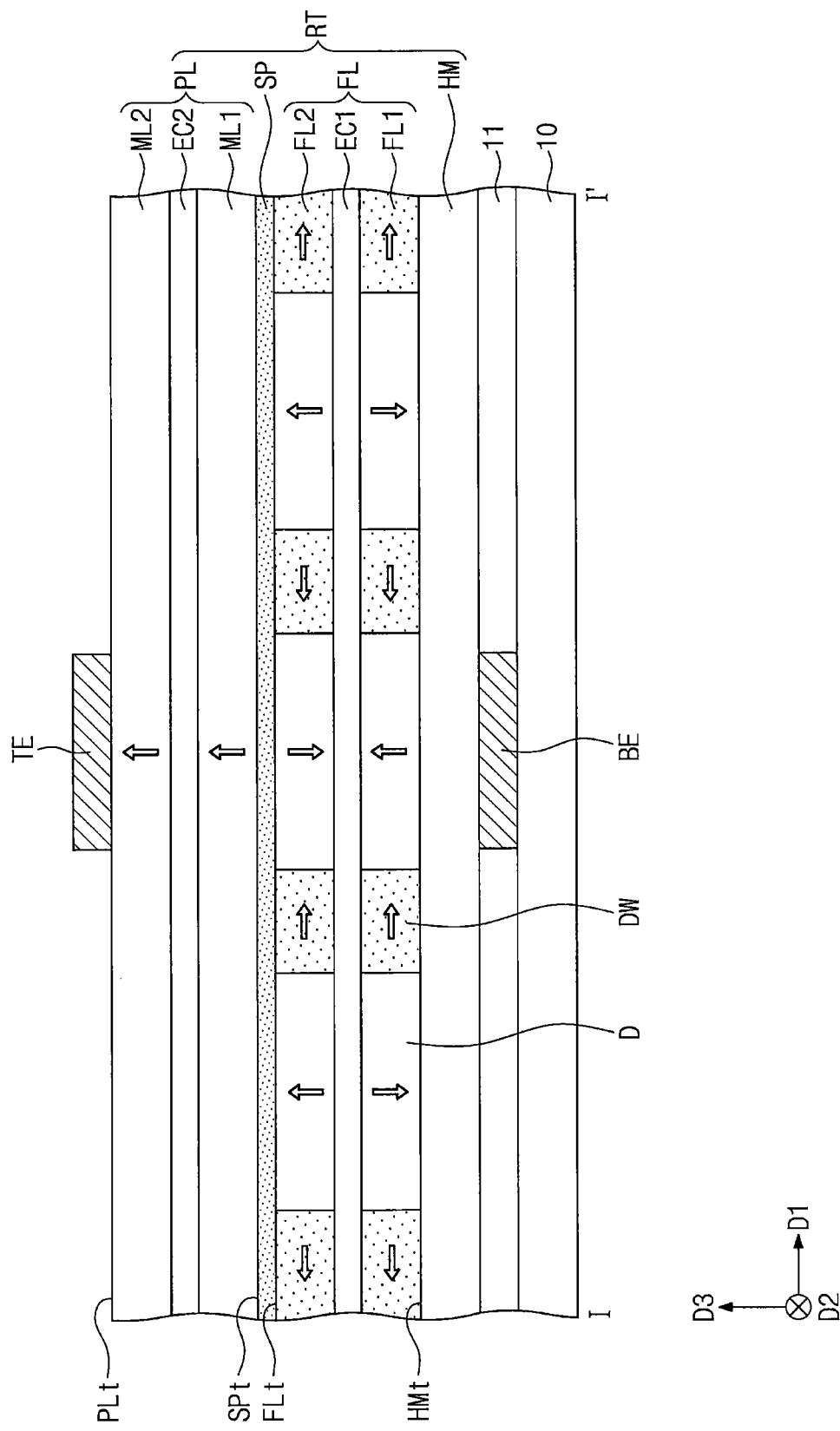

FIG. 6 is a plan view illustrating a magnetic packet structure array in which magnetic packet structures are arranged. FIGS. 7 to 9 are cross-sectional views taken along a line I-I' of FIG. 6 to illustrate magnetic memory devices according to some embodiments of the inventive concepts.

Referring to FIG. 6, a magnetic packet structure array RTA may be provided on a substrate 10. The substrate 10 may be a semiconductor substrate. For example, the substrate 10 may include silicon (Si), germanium (Ge), or silicon-germanium (SiGe). The magnetic packet structure array RTA may include magnetic packet structures RT. The magnetic packet structures RT may be connected to a bit line BL. A single bit line BL connected to the magnetic packet structures RT is illustrated as an example. Alternatively, the bit line BL may be provided in plurality. When the bit line BL is provided in plurality, the read and/or write operation may be performed at the same time at a plurality of points.

The first current C1 may flow through each of the magnetic packet structures RT in the first direction D1 or the direction opposite to the first direction D1. The first currents C1 of different directions and different magnitudes may flow through different magnetic packet structures RT. Since the first current C1 flows through each of the magnetic packet structures RT, the magnetic domains D and the magnetic domain walls DW may move in the first direction D1 or the direction opposite to the first direction D1. The magnetic domains D and the magnetic domain walls DW may move to determine the magnetic domain 200 overlapping with the top electrode TE in the third direction D3. The second current C2 may flow between the top electrode TE and the magnetic packet structure RT in the third direction D3 or the direction opposite to the third direction D3. A resistance of the magnetic domain 200 overlapping with the top electrode TE in the third direction D3 may be measured using the second current C2 to perform the read operation. In addition, the magnetization direction of the magnetic domain 200 overlapping with the top electrode TE in the third direction D3 may be reversed by the second current C2 having a different magnitude to perform the write operation.

Referring to FIGS. 7 to 9, in the magnetic memory device according to some embodiments of the inventive concepts, each of the free layer FL and the pinned layer PL may have a single-layered structure or a synthetic anti-ferromagnetic (SAF) structure. The free layer FL having the single-layered structure and the pinned layer PL having the SAF structure may be substantially the same as described above with reference to FIG. 1. Unlike the drawings, each of the free layer FL and the pinned layer PL may have a multi-layered structure including four or more layers synthesized by an exchange coupling method or another method.

Referring to FIG. 7, an insulating layer 11 including the bottom electrode BE may be provided on the substrate 10. The magnetic packet structure RT may be provided on the bottom electrode BE and the insulating layer 11. The magnetic packet structure RT extending in the first direction D1 may include the conductive line HM, the free layer FL, the spacer layer SP, and the pinned layer PL. The top surface HMt of the conductive line HM, the top surface FLt of the free layer FL, the top surface SPt of the spacer layer SP and the top surface PLt of the pinned layer PL may have substantially the same area. Each of the free layer FL and the pinned layer PL may have the single-layered structure. The free layer FL may include the magnetic domains D and the magnetic domain walls DW between the magnetic domains D. The bottom electrode BE and the top electrode TE may overlap with a portion of the magnetic packet structure RT in the third direction D3.

Referring to FIG. 8, the free layer FL may have a synthetic anti-ferromagnetic (SAF) structure. In other words, the free layer FL may include a first magnetic layer FL1, an exchange coupling layer EC1, and a second magnetic layer FL2. Each of the first and second magnetic layers FL1 and FL2 may include magnetic domains D and magnetic domain walls DW. The magnetic domains D of the first and second magnetic layers FL1 and FL2, which face each other in the third direction D3, may have magnetization directions anti-parallel to each other. In some embodiments, magnetization directions of the magnetic domain walls DW and the magnetic domains D connected through the magnetic domain walls DW may be changed in a clockwise direction while traveling in the first direction D1. In other words, magnetization distributions of the first and second magnetic layers FL1 and FL2 may have the same chirality or symmetry. However, embodiments of the inventive concepts are not limited thereto. In certain embodiments, the magnetization distributions of the first and second magnetic layers FL1 and FL2 may have different chiralities.

The SAF structure may improve or increase magnetization stability of the free layer FL by the exchange coupling layer EC1. In addition, the free layer FL of the SAF structure may reduce magnitudes of stray fields of the magnetic domains D affecting each other. Moreover, the free layer FL of the SAF structure may have improved thermal stability to improve stability of data stored in the magnetic domains D. Furthermore, the free layer FL of the SAF structure may increase an accumulation amount of electrons, and thus the magnitude of the critical current density $J_c$ required to reverse the magnetization direction may be reduced.

Except for the free layer FL of the SAF structure, other components and features of the magnetic memory device of FIG. 8 may be substantially the same or similar as corresponding components and features of the magnetic memory device described with reference to FIG. 7.

Referring to FIG. 9, each of the free layer FL and the pinned layer PL may have a synthetic anti-ferromagnetic (SAF) structure. In other words, the free layer FL may include a first magnetic layer FL1, a first exchange coupling layer EC1, and a second magnetic layer FL2. The pinned layer PL may include a third magnetic layer ML1, a second exchange coupling layer EC2, and a fourth magnetic layer ML2.

Except for the free layer FL and the pinned layer PL which have the SAF structures, other components and features of the magnetic memory device of FIG. 9 may be substantially the same or similar as corresponding components and features of the magnetic memory devices described with reference to FIGS. 7 and/or 8.

According to the embodiments of the inventive concepts, the pinned layer may be formed on the free layer without a patterning process, and thus the reliability of the magnetic memory device may be improved. In addition, even though the pinned layer is not patterned, the flow of the current may be confined between the top and bottom electrodes due to the low resistivity of the spacer layer. Thus, the read and write operations may be accurately performed.

Furthermore, the magnetic memory device may include the magnetic packet structure using the movement principle of the magnetic domain wall, and thus the integration density of the magnetic memory device may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A magnetic memory device comprising:
a conductive line extending in a first direction;
a bottom electrode on a portion of a bottom surface of the conductive line;
a free layer and a pinned layer stacked on the conductive line;
a spacer layer between the free layer and the pinned layer; and
a top electrode on a portion of a top surface of the pinned layer,
wherein the conductive line, the free layer, the pinned layer and the spacer layer have respective side surfaces perpendicular to the first direction,
wherein the respective side surfaces are aligned with each other, and
wherein respective lengths of a top surface of the free layer and a top surface of the pinned layer are greater than respective lengths of top surfaces of the bottom and top electrodes in the first direction.

2. The magnetic memory device of claim 1, wherein a resistivity of the spacer layer is less than a resistivity of the conductive line.

3. The magnetic memory device of claim 1, wherein the conductive line comprises at least one of iridium (Ir), tantalum (Ta), platinum (Pt), palladium (Pd), bismuth (Bi), titanium (Ti), or tungsten (W).

4. The magnetic memory device of claim 1,
wherein a length of the top surface of the free layer in the first direction is substantially equal to a length of the top surface of the pinned layer in the first direction.

5. The magnetic memory device of claim 1, wherein the free layer and/or the pinned layer comprise:
a first magnetic layer and a second magnetic layer; and
an exchange coupling layer between the first and second magnetic layers,
wherein the exchange coupling layer couples the first and second magnetic layers such that magnetization directions of the first and second magnetic layers are antiparallel to each other.

6. The magnetic memory device of claim 1, wherein a magnetization direction of the pinned layer is perpendicular to a top surface of the free layer.

7. The magnetic memory device of claim 1, further comprising:
a bit line electrically connected to the top electrode;
a selection element electrically connected to the bottom electrode; and
a word line configured to control the selection element.

8. The magnetic memory device of claim 1,
wherein the bottom electrode and the top electrode overlap with each other and with the conductive line in a second direction that is perpendicular to the first direction, and
wherein the free layer, the pinned layer and the spacer layer are between the bottom electrode and the top electrode.

9. The magnetic memory device of claim 1,
wherein the free layer comprises a plurality of regions,
wherein each region of the plurality of regions has a respective magnetization direction, and
wherein respective lengths of ones of the plurality of regions in the first direction are greater than respective lengths of the bottom and top electrodes in the first direction.

10. A magnetic memory device comprising:
a substrate;
packet structures extending in a first direction on the substrate and spaced apart from each other in a second direction perpendicular to the first direction;
bottom and top electrodes spaced apart from each other in a third direction perpendicular to the first and second directions with respective portions of corresponding ones of the packet structures interposed therebetween;
transistors connected to the bottom electrodes of each of the packet structures; and a bit line connected to the top electrodes of the packet structures, wherein each of the packet structures comprises a free layer, a pinned layer on the free layer, a spacer layer between the free layer and the pinned layer, and a conductive line between the free layer and a respective one of the bottom electrodes, wherein respective areas of top surfaces of the free layer, the pinned layer, the spacer layer and the conductive line are substantially equal to each other, and wherein respective lengths of the bottom and top electrodes in the first direction are less than respective lengths of the packet structures in the first direction.

11. The magnetic memory device of claim 10, further comprising:
upper packet structures spaced apart from the packet structures in the third direction, or lower packet structures spaced apart from the packet structures in a direction opposite to the third direction.

12. The magnetic memory device of claim 10, wherein respective widths of the bottom and top electrodes in the second direction are equal to or less than respective widths of the packet structures in the second direction.

13. The magnetic memory device of claim 10, wherein the free layer or the pinned layer comprises at least two magnetic layers and at least one non-magnetic layer.

14. A magnetic memory device comprising:
a first magnetic layer having a constant magnetization direction;
a second magnetic layer on the first magnetic layer;
a spacer layer between the first magnetic layer and the second magnetic layer;
a conductive line on a bottom surface of the first magnetic layer;
a bottom electrode on the conductive line; and
a top electrode on the first magnetic layer, wherein the first magnetic layer, the second magnetic layer, the spacer layer and the conductive line extend in a first direction and have respective top surfaces of which areas are substantially equal to each other, and wherein the bottom and top electrodes have respective top surfaces of which areas are less than respective areas of the first magnetic layer, the second magnetic layer, the spacer layer and the conductive line.

15. The magnetic memory device of claim 14, wherein the spacer layer has a thickness of about 0.1 nm to about 10 nm.

16. The magnetic memory device of claim 14, wherein the spacer layer comprises at least one of silver (Ag), copper (Cu), chromium (Cr), gold (Au), rhodium (Rh), CrMn, or $Ag_3Mg$.

17. The magnetic memory device of claim 14, wherein the first magnetic layer and the second magnetic layer have perpendicular magnetic anisotropy.

18. The magnetic memory device of claim 14, wherein the first magnetic layer, the second magnetic layer, the spacer layer and the conductive line are between the bottom and top electrodes, and wherein a magnetization direction of a partial region of the second magnetic layer is adjusted by a current flowing between the bottom and top electrodes.

19. The magnetic memory device of claim 18, wherein the first magnetic layer, the second magnetic layer, the spacer layer and the conductive line have side surfaces perpendicular to the first direction, and wherein the side surfaces are aligned with each other.

* * * * *